United States Patent [19]

Taura et al.

[11] Patent Number: 5,034,926
[45] Date of Patent: Jul. 23, 1991

[54] NON-VOLATILE SEMICONDUCTOR MEMORY

[75] Inventors: Tadayuki Taura, Kawasaki; Masamichi Asano, Tokyo; Sadayuki Yokoyama, Kawasaki, all of Japan

[73] Assignee: Kabushiki Kaisha Toshiba, Kawasaki, Japan

[21] Appl. No.: 392,070

[22] Filed: Aug. 10, 1989

[30] Foreign Application Priority Data

Aug. 12, 1988 [JP] Japan .................. 63-201331

[51] Int. Cl.⁵ .............................................. G11C 16/02
[52] U.S. Cl. ...................................... 365/218; 365/185; 365/230.03
[58] Field of Search ............... 365/218, 185, 230.03; 357/23.5

[56] References Cited

U.S. PATENT DOCUMENTS 4,630,087 12/1986 Momodomi .................. 357/23.5

OTHER PUBLICATIONS

Masuoka et al., "A 256-Kbit Flash E2PROM Using Triple-Polysilicon Technology", IEEE Journal of Solid-State Circuits, vol. SC-22, No. 4, pp. 548-552. Aug. 1987.

Primary Examiner—James W. Moffitt
Attorney, Agent, or Firm—Finnegan, Henderson, Farabow, Garrett, and Dunner

[57] ABSTRACT

In a non-volatile semiconductor memory of this invention, a memory cell array constituted by a plurality of memory cells is divided into a plurality of blocks, and erase lines which are common to the respective blocks and independent from each other are arranged. In the data write mode, a predetermined voltage is applied to only the erase line connected to a selected one of the blocks.

16 Claims, 12 Drawing Sheets

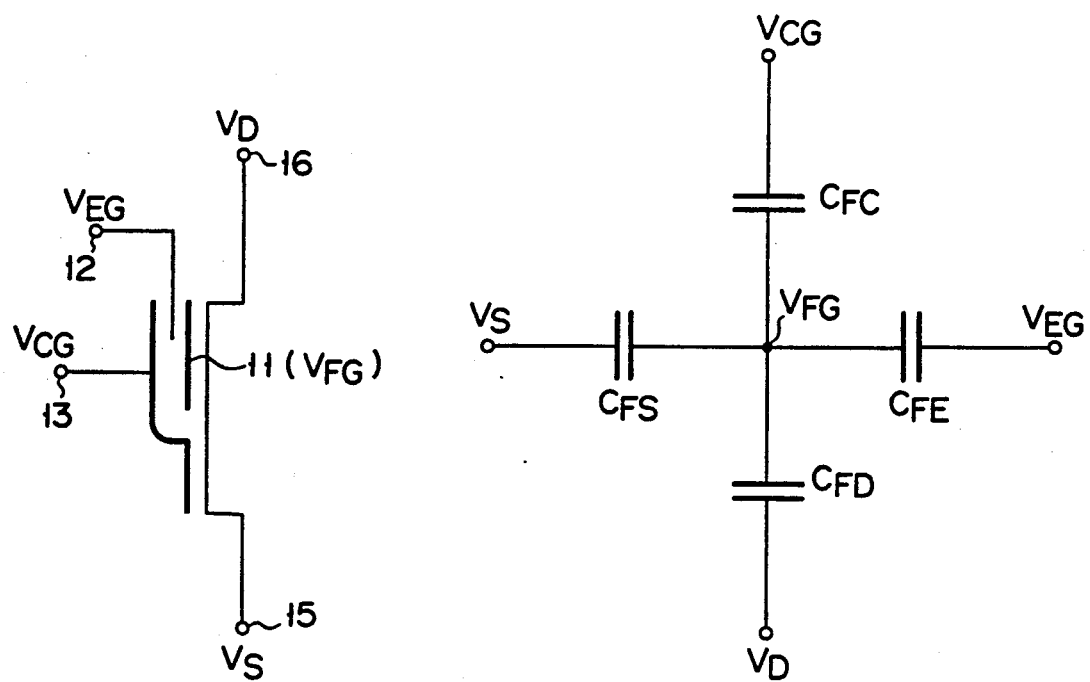
FIG. 2 PRIOR ART
FIG. 3 PRIOR ART
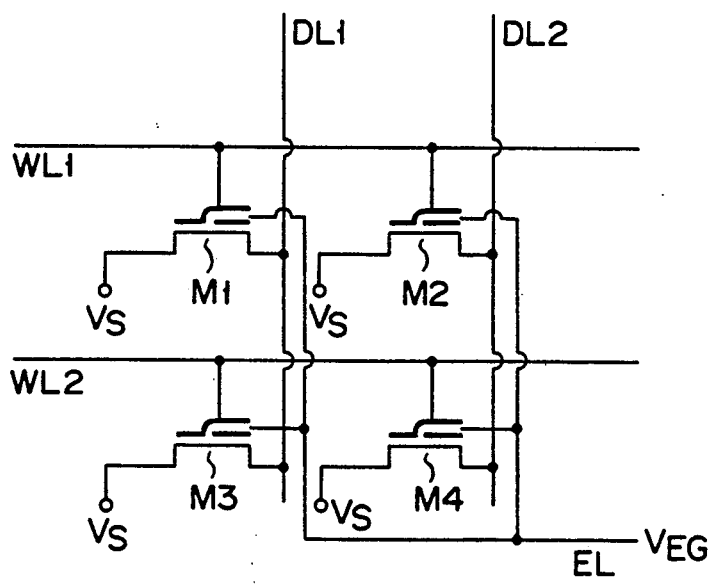
FIG. 4 PRIOR ART

| CELL | DATA STORED IN MEMORY CELL | WL1 | WL2 | DL1 | DL2 | V$_{EG}$ | V$_{FG}$ | V$_{EG}$−V$_{FG}$ | MODE |
|---|---|---|---|---|---|---|---|---|---|
| M1 | "1" | 12.5V | | 10V | | 5V | — | — | DATA WRITE |
|  | "0" | | | | | | | | |
| M2 | "1" | 12.5V | | | 0V | 5V | 10.5V | −4.5V | ERRONEOUS WRITING OF DATA |
|  | "0" | | | | | | 4.5V | 0.5V | — |
| M3 | "1" | | 0V | 10V | | 5V | 3.0V | 2.0V | — |
|  | "0" | | | | | | −3.0V | 8.0V | ERRONEOUS ERASING OF DATA |
| M4 | "1" | | 0V | | 0V | 5V | 3.0V | 2.0V | — |
|  | "0" | | | | | | −3.0V | 8.0V | ERRONEOUS ERASER OF DATA |

F I G. 5 PRIOR ART

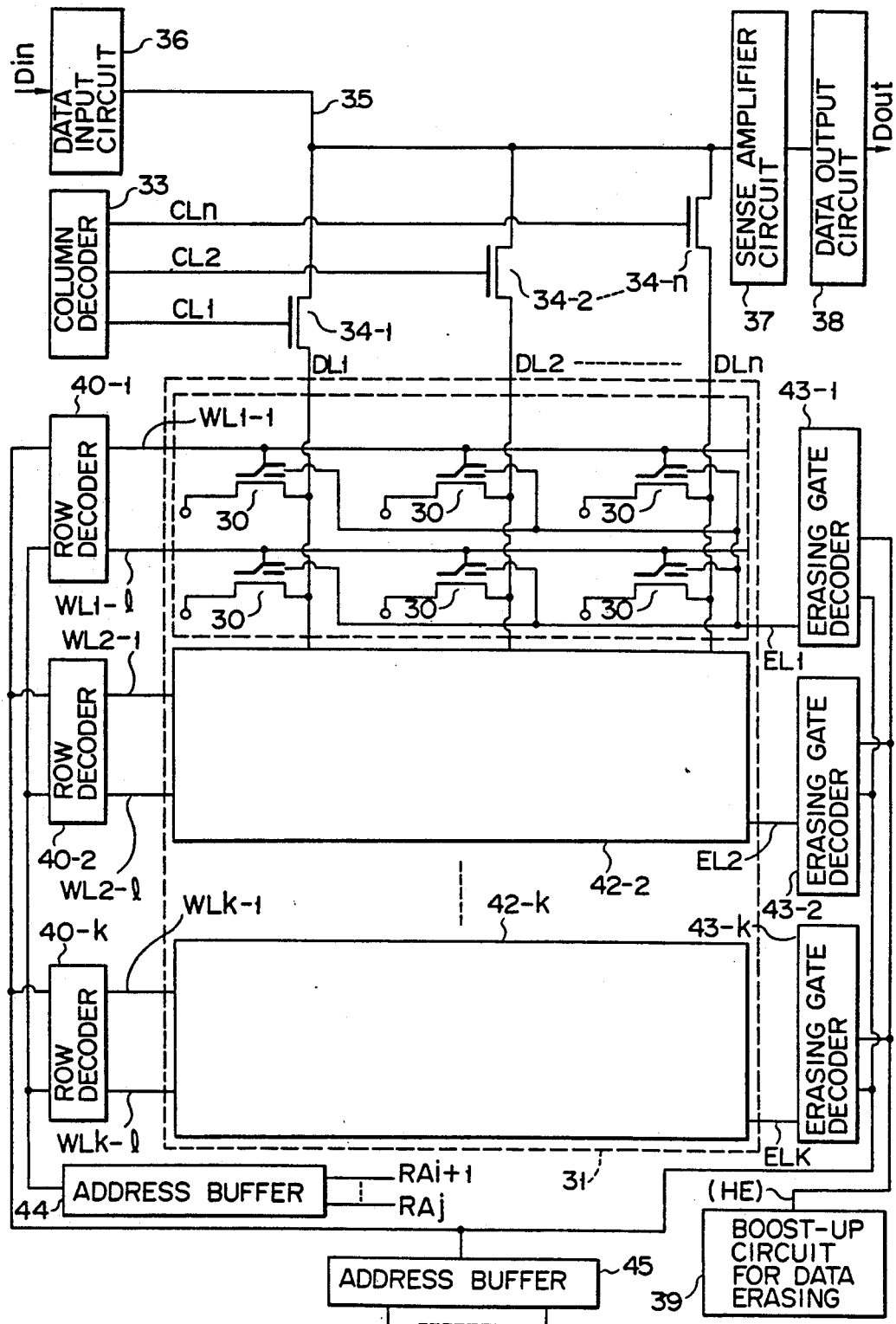
F I G. 7

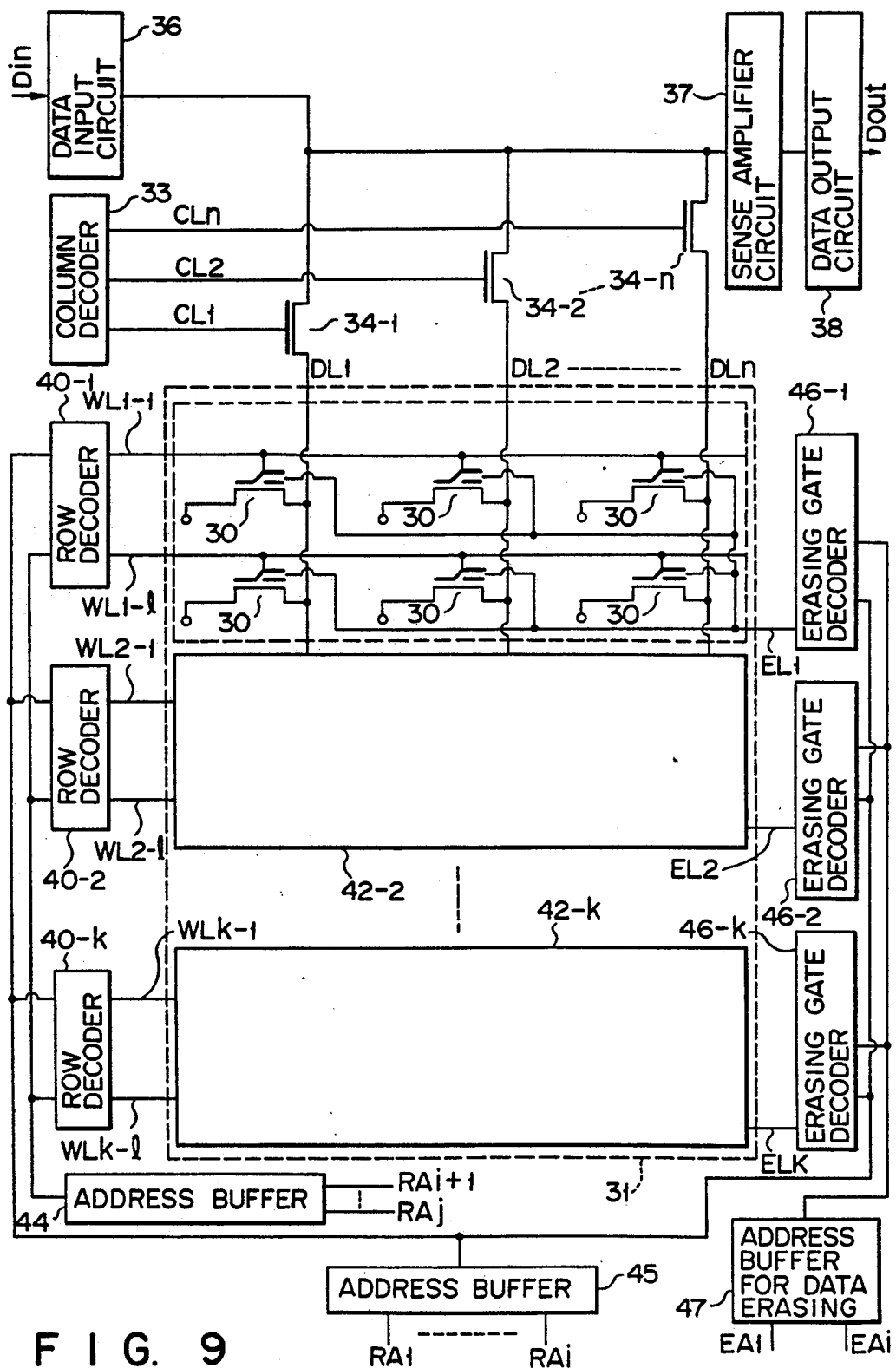
F I G. 9

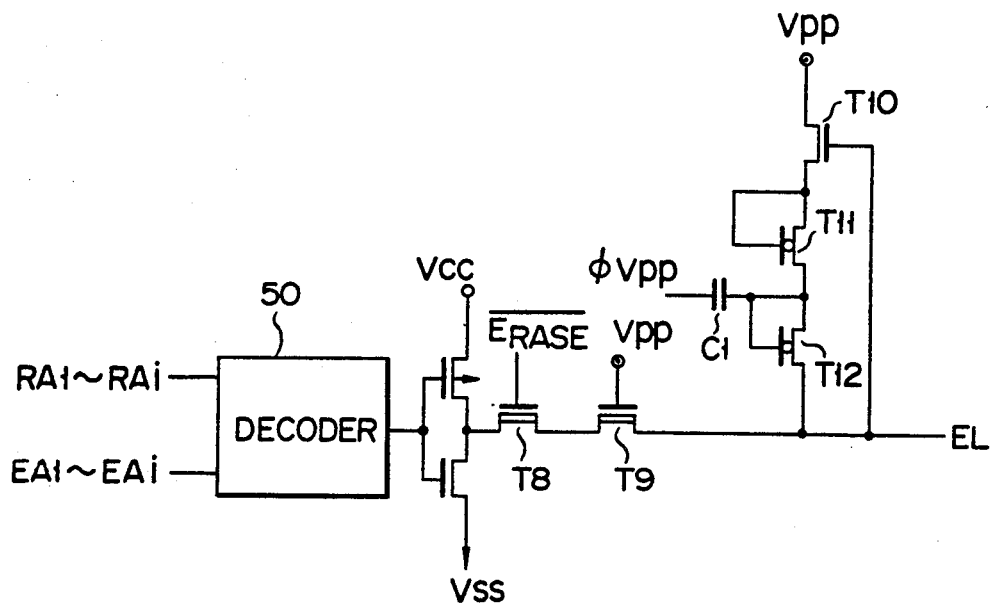
F I G. 10
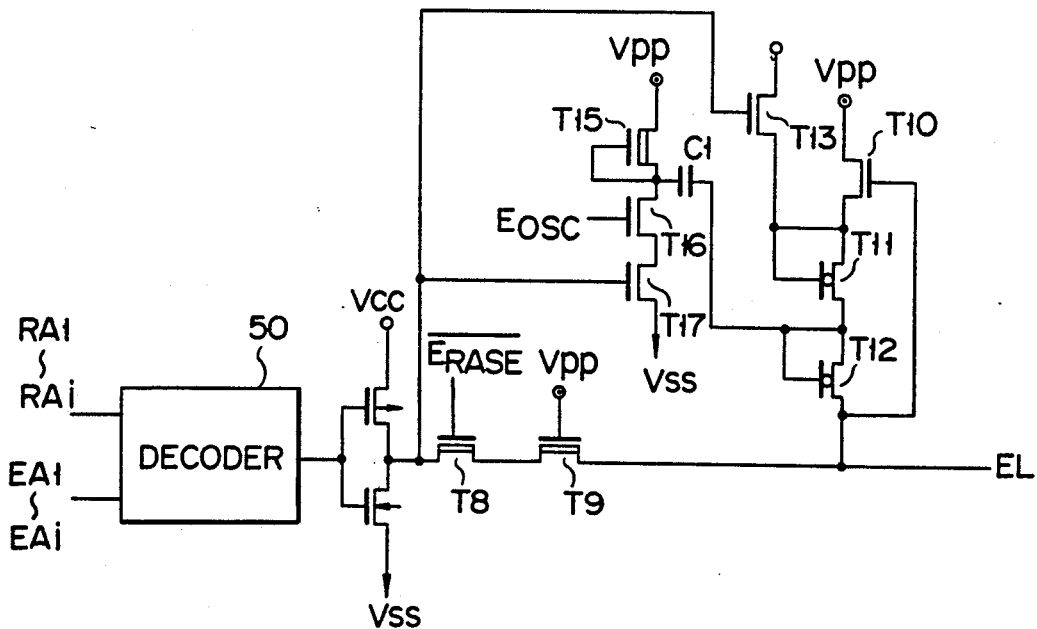
F I G. 11

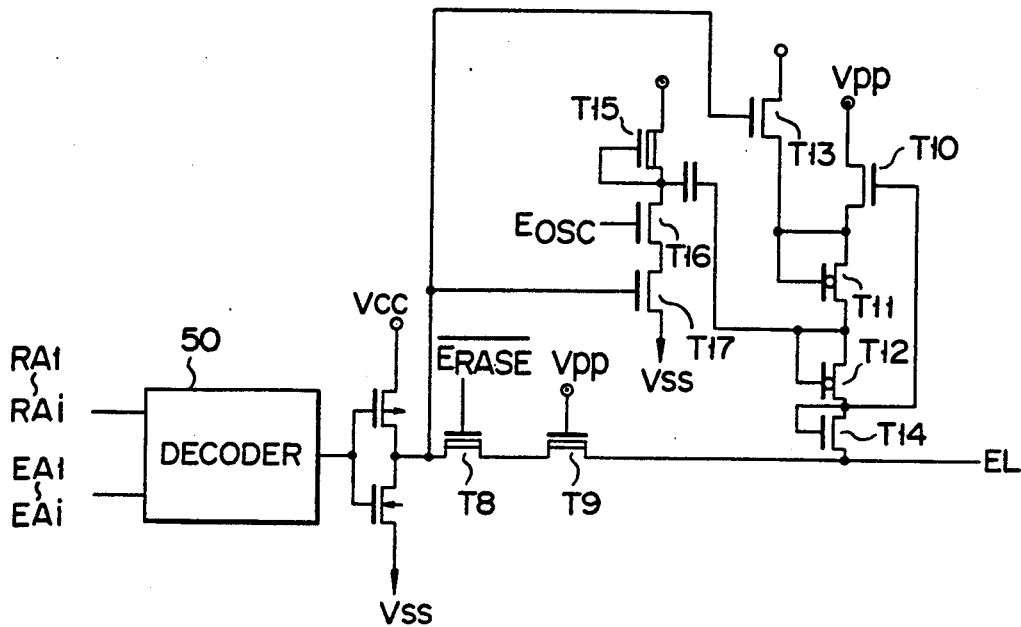
F I G. 12
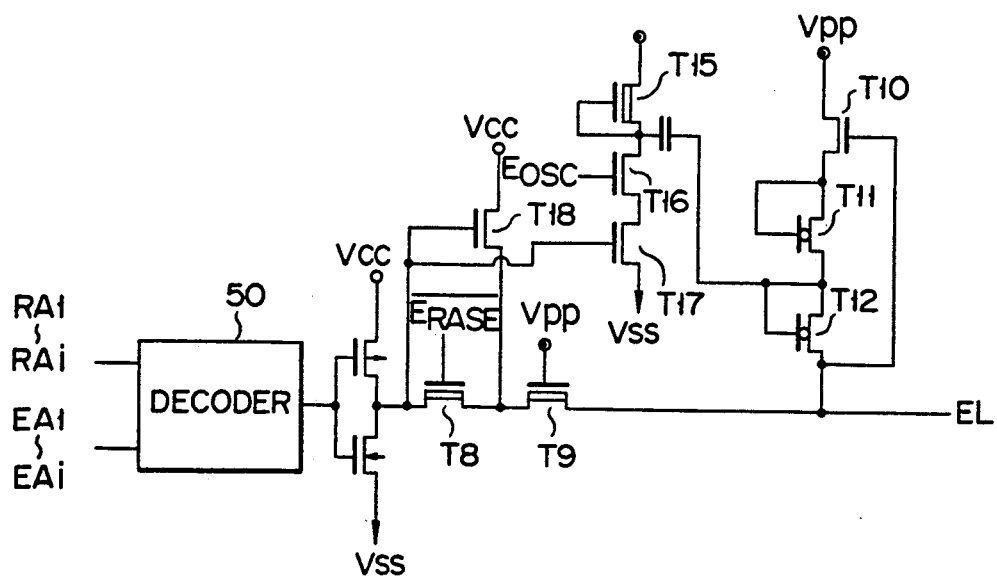
F I G. 13

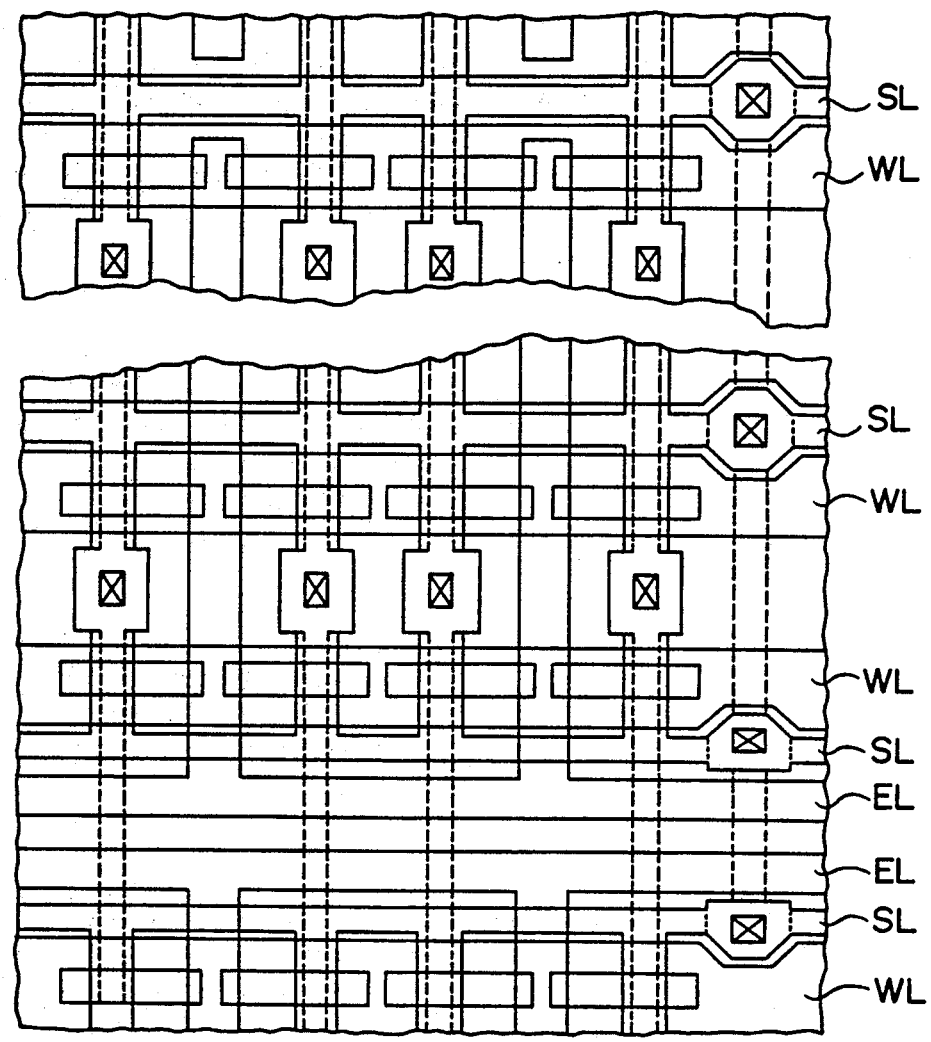
F I G. 14

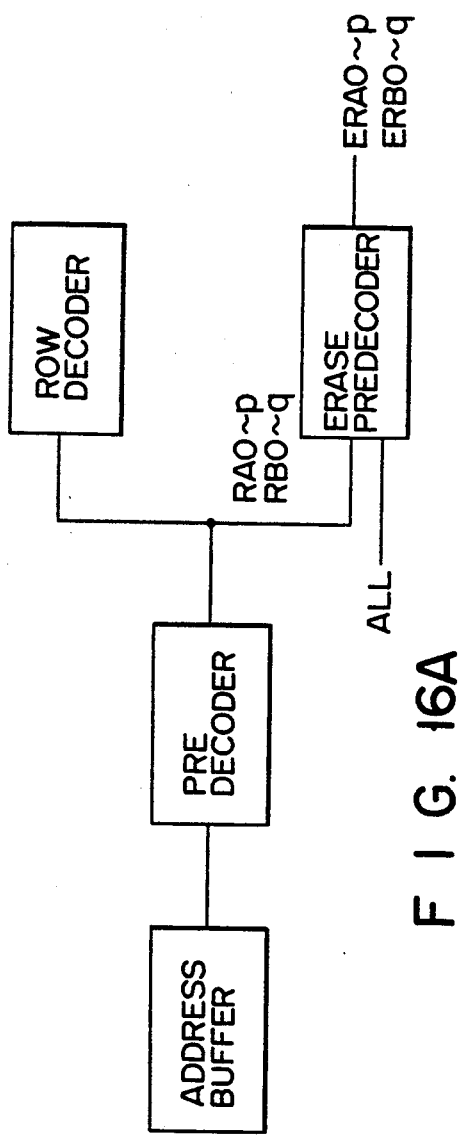
F I G. 16A
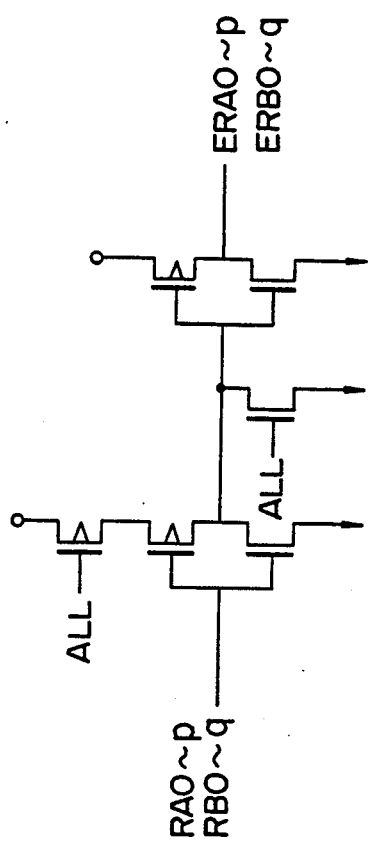
F I G. 16B

NON-VOLATILE SEMICONDUCTOR MEMORY

BACKGROUND OF THE INVENTION

1. Field of the Invention

The present invention relates to a non-volatile semiconductor memory capable of electrically erasing data and, more particularly, to a semiconductor memory capable of improving reliability by shortening a voltage stress time of each non-selected cell and preventing erroneous erasure.

2. Description of the Related Art

In comparison with ultraviolet-erasable type EPROMs, EEPROMs (Electrically Erasable and Programmable ROMs) from which stored data can be electrically erased and in which new data can be written are easy to use. For example, data can be erased by electrical signals in a state wherein an EEPROM is kept mounted on a board. Therefore, the demand for EEPROMs to be used for control operation, IC cards (memory cards), and the like has greatly increased. EEPROMs capable of realizing a large capacity employ a memory cell having an arrangement shown in FIGS. 1A to 1C are especially popular.

FIG. 1A is a plan view of a pattern; FIG. 1B, a sectional view taken along a line A1-A2 in FIG. 1A; and FIG. 1C, a sectional view taken along a line B1-B2 in FIG. 1A. Referring to FIGS. 1A to 1C, reference numeral 11 denotes a floating gate consisting of a first polysilicon layer; 12, an erasing gate consisting of a second polysilicon layer; 13, a control gate consisting of a third polysilicon layer, which is also used as a word line of the memory cell; 14, a p-type substrate; 15 and 16, a source and a drain formed on the substrate 14, respectively; 17, a contact hole; 18, a data line consisting of an aluminum layer connected to the drain 16; 19, a gate insulating film of a floating gate transistor portion; 20, a gate insulating film formed between the floating gate 11 and the erasing gate 12 and 21, a gate insulating film formed between the floating gate 11 and the control gate 13. The gate insulating film 21 is constituted by a three-layer film of an O-N-O (Oxide-Nitride-Oxide) structure. In addition, reference numeral 22 denotes a gate insulating film formed between the erasing gate 12 and the control gate 13 and having an O-N-O structure; 23, a gate insulating film of a selection transistor portion using the third polysilicon layer as a gate electrode; 24, a field insulating film; and 25, an insulating interlayer.

FIG. 2 shows an equivalent circuit of the memory cell shown in FIGS. 1A to 1C. FIG. 3 shows an equivalent circuit of a capacitance system. Referring to FIG. 2, reference symbol $V_D$ denotes a drain voltage; $V_S$, a source voltage; $V_{FG}$, a floating gate voltage; $V_{EG}$, an erasing gate voltage; and $V_{CG}$, a control gate voltage. Referring to FIG. 3, reference symbol $C_{FC}$ denotes a capacitance between the floating gate 11 and the control gate 13; $C_{FE}$, a capacitance between the floating gate 11 and the erasing gate 12; $C_{FD}$, a capacitance between the floating gate 11 and the drain 16; and $C_{FS}$, another capacitance with respect to the floating gate 11 between floating gate 11 and source 15. In this capacitance system, an initial value $Q_{(1)}$ of a charge amount corresponding to all the capacitances can be given by the following equation:

$$Q_{(1)} = (V_{FG} - V_{CG}) \cdot C_{FC} + (V_{FG} - V_{EG}) \cdot C_{FE} + (V_{FG} - V_D) \cdot C_{FD} + (V_{FG} - V_S) \cdot C_{FS} \quad (1)$$

If the sum of all the capacitances is represented by $C_T$, then $$C_T = C_{FC} + C_{FE} + C_{FD} + C_{FS} \quad (2)$$

Therefore, the voltage $V_{FG}$ to be applied to the floating gate is given by the following equation:

$$V_{FG} = \{(V_{CG} \cdot C_{FC} + V_{EG} \cdot C_{FE} + V_D \cdot C_{FD} + V_S \cdot C_{FS})/C_T\} + \{Q_{(1)}/C_T\} \quad (3)$$

Substitutions of $Q_{(1)}/C_T = V_{FG(1)}$ and $V_S = 0$ V into equation (3) yield:

$$V_{FG} = \{V_{CG} \cdot C_{FC} + V_{EG} \cdot C_{FE} + V_D \cdot C_{FD})/C_T\} + V_{FG(1)} \quad (4)$$

The memory cells described above are arranged in an actual memory to form a matrix. In this case, however, in order to simplify description, a 4-bit memory cell array, shown in FIG. 4, will be considered. FIG. 4 is a circuit diagram of a memory cell array having memory cells M1 to M4. The drains of these four memory cells M1 to M4 are connected to either of two data lines DL1 and DL2. Their control gates are connected to either of two word lines WL1 and WL2. The erasing gates of all the memory cells M1 to M4 are commonly connected to an erase line EL. A reference voltage of, e.g., 0 V is applied to their sources. Data erasure of the memory cell array having the abovedescribed arrangement is performed in the following manner. Data erasure is collectively performed in all the memory cells M1 to M4. For this reason, the source potential $V_S$, the drain potential $V_D$, and the control gate potential $V_{CG}$ of each memory cell are set to 0 V (i.e., the data lines DL1 and DL2 and the word lines WL1 and WL2 are set to 0 V), and the erasing gate potential $V_{EG}$ is set to a high potential of, e.g., 20 V. At this time, electrons in the floating gates are emitted into the erasing gates upon field emission due to the Fowler-Nordheim tunnel effect, and the floating gates are charged and set at a positive potential. Therefore, if the potential VFG(1) in each floating gate is set to, e.g., +3 V (a threshold value $V_{TH}$ of each floating gate transistor is set to be 1 V), an inversion layer is formed under the floating gate, and the threshold voltage of each memory cell is decreased. This state will be referred to as a data state of "1".

A case wherein data is written in one memory cell, e.g., the memory cell M1 of the memory cell array will be considered below. When data is to be written in the selected memory cell M1, the control gate potential $V_{CG}$ of the memory cell M1, i.e., the word line WL1, is set at a high potential of, e.g., +12.5 V, the drain potential $V_D$, i.e., the data line DL1 is set at a high potential of, e.g., +10 V, and the source potential $V_S$ and the data and word lines DL2 and WL2 are set at 0 V. In addition, a power source voltage of +5 V, for example, is applied to the erasing gate. With this operation, the potential of the floating gate of the selected memory cell is increased due to the capacitance ratio of the erasing gate, and hence an easy-to-write state is obtained. As a result, the hot electron effect occurs near the drain of the selected memory cell M1, and electrons which are generated upon impact ionization are injected in the floating gate. Since the potential of the floating gate is negative in this state, if the potential $V_{FG}(1)$ in the floating gate is set at, e.g., $-3$ V, the threshold voltage of the memory cell is increased. This state will be referred to as a data state of "0". No hot electron effect occurs at the non-selected memory cells M2 to M4.

Voltage stresses acting on the non-selected cells M2 to M4 in each data state, i.e., data state of "1", "0" during a data write operation will be considered. Since the values $V_{EG} \cdot C_{FE}$ and $V_D \cdot C_{FD}$ in equation (4) in the write mode are sufficiently small as compared with the value $V_{CG} \cdot C_{FC}$, equation (4) in the write mode can be rewritten as follows:

$$V_{FG} = (C_{FC}/C_T) \cdot V_{CG} + V_{FG}(1) \quad (5)$$

Assume that a capacitance ratio $C_{FC}/C_T$ is set to be, e.g., 0.6, and that a memory cell with a data state of "1" has $V_{FG(1)} = +3$ V and a memory cell with a data state of "0" has $V_{FG(1)} = -3$ V. In addition, assume that the non-selected cell M2 on the same word line WL1 as that of the selected cell M1 has a data state of "1". In this case, since the control gate potential $V_{CG}$ of the memory cell M2 is 12.5 V, the floating gate potential $V_{FG}$ is 10.5 V according to equation (5). However since the erasing gate potential is set at 5 V, the potential of the erasing gate viewed from the floating gate, is $-5.5$ V. If a voltage of 5 V is applied to the erasing gate in this manner, the electric field of the floating gate of the non-selected cell on the same word line as that of the selected cell is reduced with respect to the erasing gate, and reliability against an erroneous operation due to erroneous write operation can be increased. FIG. 5 collectively shows voltage stresses of the erasing gates acting on the floating gates of the four memory cells M1 to M4. Referring to FIG. 4, when the non-selected memory cells M3 and M4 connected to the word line WL2, different from the word line of the selected memory cell, have a data state of "0", the voltage stress of the erasing gate acting on the floating gate becomes maximum. As is apparent from FIG. 5, in the non-selected cells M3 and M4, a voltage of +8 V is applied between the floating gate and the erasing gate to form a weak erasing state, and electrons in the floating gate tend to be emitted to the erasing gate, thus causing erroneous erasure.

FIG. 6 is a circuit diagram showing an arrangement of a conventional semiconductor memory using the abovedescribed memory cells. The drain of each cell 30 of a memory cell array 31 in FIG. 6 is connected to either of n data lines DL1 to DLn, and its control gate is connected to either of m word lines WL1 to WLm. At the same time, the erasing gates of all the memory cells are commonly connected to an erase line EL. A voltage of, e.g., 0 V is applied to the source of each memory cell. In this case, since the erasing gates of all the memory cells 30 in the memory cell array 31 are commonly connected, the voltage $V_{EG}$ is applied to the erasing gates of all the memory cells 30 in the data write mode. Referring to FIG. 6, reference numeral 32 denotes a row decoder; 33, a column decoder; 34-1 to 34-n, column selection transistors; 35, a bus line; 36, a data input circuit; 37, a sense amplifier circuit; 38, a data output circuit; 39, a boost-up circuit for data erasing; and 41, an address buffer.

A case wherein a data write time per cell is represented by t and all the bits are written will be considered. In a non-selected state, a maximum stress time in a weak erasing state in which each control gate is set at 0 V (described with reference to FIG. 5) is $\{(m-1) \times n\} \times t$ (m is the number of row lines and n is the number of column lines) per bit.

As described above, in the conventional semiconductor memory shown in FIG. 6, in the data write mode, when a high voltage is applied to the drain and the control gate of a given memory cell 30 with its source and the substrate being set at "0" level, and hot electrons are injected in the floating gate, a voltage of 5 V is also applied to the erasing gate.

As a result, in FIG. 3, the voltage $V_{FG}$ rises to a certain potential by a value corresponding to the capacitance $C_{FE}$. For this reason, the write speed is increased to improve write efficiency. That is, the write speed per memory cell is increased, and hence the write speed of the overall memory is increased. The conventional semiconductor memory reduces an erroneous write stress on a non-selected cell on the same word line.

In contrast to this, in spite of the fact that the control gate of a non-selected cell on a word line different from that of a selected cell is set at 0 V, since the voltage $V_{EG}$ is applied to its erasing gate, the field intensity of the erasing gate with respect to the floating gate becomes larger than that of a non-selected cell on the same word line as that of the selected cell. Therefore, erroneous erasure tends to occur. In addition, the probability of erroneous erasure is increased in proportion to the voltage stress time. This stress time depends on the storage capacity of the memory. The stress time is prolonged with an increase in storage capacity of the memory, thus posing a problem in terms of reliability. For example, in a 1 M-bit (128 K words × 8 bits) memory, n = 128 and m = 1,024 (in FIG. 6). If a write time per bit is 1 ms, the maximum time during which an erroneous write stress acts on a given non-selected cell on the same word line as that of a selected cell is:

$$1 \text{ ms} \times 127 = 127 \text{ ms}$$

and, the maximum time during which an erroneous stress acts on a given non-selected cell on a word line different from that of the selected cell becomes very long as follows:

$$1 \text{ ms} \times (1,024 - 1) \times 128 = 130,944 \text{ ms} \approx 131 \text{ s}.$$

SUMMARY OF THE INVENTION

The present invention has been made in consideration of the above situation, and has as its object to provide a highly reliable non-volatile semiconductor memory in which a memory cell array is divided into a plurality of blocks to reduce the time during which voltage stress acts on non-selected cells to prevent erroneous operation of memory cells during write operation.

According to the present invention, in a non-volatile semiconductor memory comprising transistors as non-volatile memory cells, each having a floating gate and control and erasing gates each of which is capacitively coupled to the floating gate, for electrically rewriting data, a memory cell array consisting of the memory cells is divided into a plurality of blocks. Common erase lines which are independent from each other are respectively arranged for the blocks, and a predetermined voltage is applied to only the erase line of a selected block in a data write mode.

According to the non-volatile semiconductor memory of the present invention, in the data write mode, a positive voltage, for example, is applied to the erase line of a selected block, and the erase lines of non-selected blocks remain at 0 V. Therefore, no voltage stress is applied to the cells in the non-selected blocks, and the voltage stress time of the erasing gate with respect to the floating gate of each non-selected cell can be shortened. As a result, erroneous erasure of the non-selected cells in the write mode does not easily occur, and hence the reliability can be increased.

That is, according to the semiconductor memory of the present invention, erroneous write operation of non-selected cells on the same word line as that of selected cells can be prevented without degrading the write efficiency of the selected cells. In addition, the stress time of the erasing gate with respect to the floating gate of each non-selected cell on a word line different from that of a selected cell can be shortened. Therefore, the semiconductor memory of the present invention can prevent erroneous erasure and increase reliability in data retention. Moreover, the semiconductor memory of the present invention can reduce the stress time of an erasing gate with respect to a floating gate. Therefore, degradation of a gate insulating film due to write/erase cycles can be suppressed, and the number of write/erase cycles can be increased. In addition, data retention characteristics can be improved.

BRIEF DESCRIPTION OF THE DRAWINGS

FIG. 2 is an equivalent circuit diagram of the memory cell in FIGS. 1A to 1C;

FIG. 3 is an equivalent circuit diagram of a capacitance system of the memory cell in FIGS. 1A to 1C;

FIG. 4 is a circuit diagram of a memory cell array having four memory cells;

FIG. 5 is a table showing voltage stresses of the erasing gates with respect to the floating gates of the four memory cells in FIG. 4;

FIG. 7 is a circuit diagram showing an arrangement of a semiconductor memory of the present invention;

FIG. 9 a circuit diagram showing another arrangement of the semiconductor memory of the present invention;

FIG. 10 is a circuit diagram of an erasing gate decoder in FIG. 9;

FIGS. 11 to 13 are circuit diagrams of erasing gate decoders, which are shown in the arrangement of the semiconductor memory of the present invention in FIG. 9 and which are different from the erasing gate decoder in FIG. 10;

FIGS. 14 and 15 are plan views showing patterns of the semiconductor memories in FIGS. 7 and 9;

FIG. 16A is a circuit diagram showing another detailed arrangement of an input section of the semiconductor memories of the present invention in FIGS. 7 and 9; and FIG. 16B is a circuit diagram showing a detailed arrangement of an erase predecoder in FIG. 16A.

DETAILED DESCRIPTION OF THE PREFERRED EMBODIMENTS

Figure 1A:
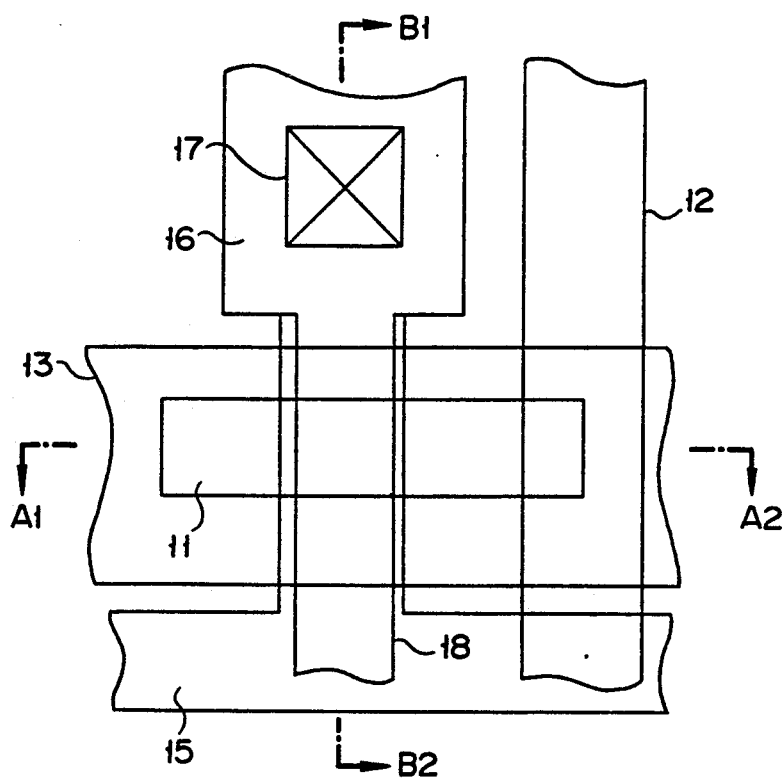
FIGS. 1A to 1C are views showing an arrangement of a memory cell used for a conventional EEPROM.
Figure 1B:
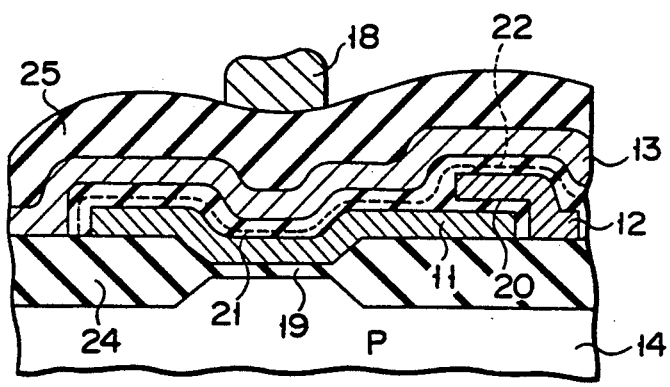
Figure 1C:
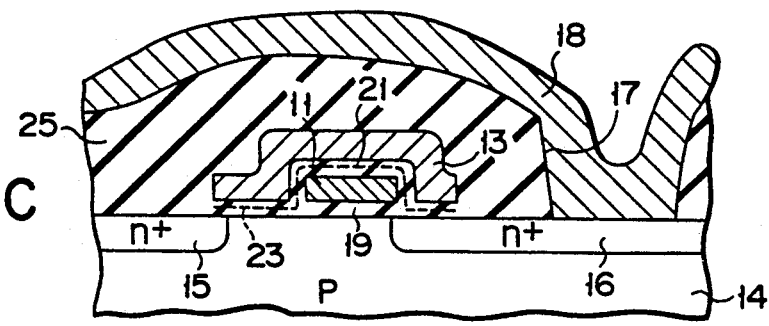

Embodiments of the present invention will be described below with reference to the accompanying drawings. FIG. 7 is a circuit diagram showing a memory according to a first embodiment of the present invention, considering the above-described points. This memory is a 1-bit read/write EEPROM. In this memory, memory cells 30 of a memory cell array 31 shown in FIG. 7 are divided into blocks which are arranged in the form of a matrix consisting of rows and columns. The control gates of the memory cells arranged on the respective rows are commonly connected to either of word lines WL1-1 to WLk-l to be selected by row decoders 40-1 to 40-k respectively. The drains of the memory cells arranged on each column are commonly connected to either of data lines DL1 to DLn as column lines. The erasing gates of the memory cells in the same block memory cell array are commonly connected within the block. The commonly connected erasing gates of the respective block memory cell arrays are commonly connected to either of erase lines EL1 to ELk which are selectively operated by erasing gate decoders 43-1 to 43-k. Each erase line can be constituted by a polysilicon layer constituting an erasing gate of a memory cell. The row decoders 40-1 to 40-k arranged for the respective blocks receive an output from an address buffer 45 to select a block, and an output from an address buffer 44 to select a word line WL in the selected block, thereby selecting one word line. In addition, the erasing gate decoders 43-1 to 43-k receive the output for selecting a block from the address buffer 45, thus selecting a word line and an erase line of one block. The data lines DL1 to DLn to be selected by a column decoder 33 are connected to a common bus line 35 through column selecting transistors 34-1 to 34-n whose gates are respectively connected to column selecting lines CL1 to CLn. A data input circuit 36 of a high-voltage system is connected to the bus line 35. The circuit 36 outputs data of "0" or "1" which is set in accordance with an externally input write data signal $D_{in}$. In addition, a sense amplifier circuit 37 is connected to the sense amplifier bus line 35. The circuit 37 outputs a readout potential of "0" or "1" to the bus line 35 in accordance with storage data from the memory cell selected by the row decoders 40-1 to 40-k and the column decoder 33. Detection data from the sense amplifier circuit 37 is supplied to a data output circuit 38, and readout data $D_{out}$ is output from the data output circuit 38 to the outside of the memory.

An operation of the memory having the abovedescribed arrangement will be described below. When data is to be written, one memory cell is selected from the memory cell array 31 by the row decoders 40-1 to 40-k and the column decoder 33. At this time, a selected one of the word lines WL1-1 to WLk-l is set at a potential of +12.5 V. When data of "0" is to be written, a high potential of +10 V is output from the data input circuit 36, and is applied to the drain of the selected memory cell 30 through one of the column selection transistors 34-1 to 34-n, which is selectively turned on by an output from the column decoder 33, and through one of the data lines DL1 to DLn, which is selected by the ON transistor. At this time, as described with reference to FIG. 4, electrons are injected in the floating gate of the selected memory cell due to the hot electron effect, and the data of "0" is written. In contrast to this, when data of "1" is to be written, since a potential of 0 V is output from the data input circuit 36, movement of electrons does not occur in the selected memory cell, thus retaining the data of "1".

In the data write mode, an erasing gate decoder to which the same address is input as that of the selected row decoder block including the selected word line is selected, and +5 V which is the power source voltage is selectively applied to only the erase line of one of the block memory cell arrays 42-1 to 42-k, in which the selected memory cell is included. Other erase lines are set in a non-selected state and are set at 0 V which is the reference voltage. Note that the potential at a selected or non-selected erase line is set arbitrarily by the capacitance ratio of the memory cell and can be optimized. In the erase mode, a boost potential <HE> of, e.g., +20 V is output from a boostup circuit 39 and is applied to the erasing gate decoders 43-1 to 43-k. At this time, all the erasing gate decoders 43-1 to 43-k are set in a selected state, and all the erase lines EL1 to Elk are set at the boost potential <HE>, so that all the bits are collectively erased. At this time, all the word lines WL1-1 to WLk-1 and the data lines DL1 to DLn are set at 0 V.

Figure 8:
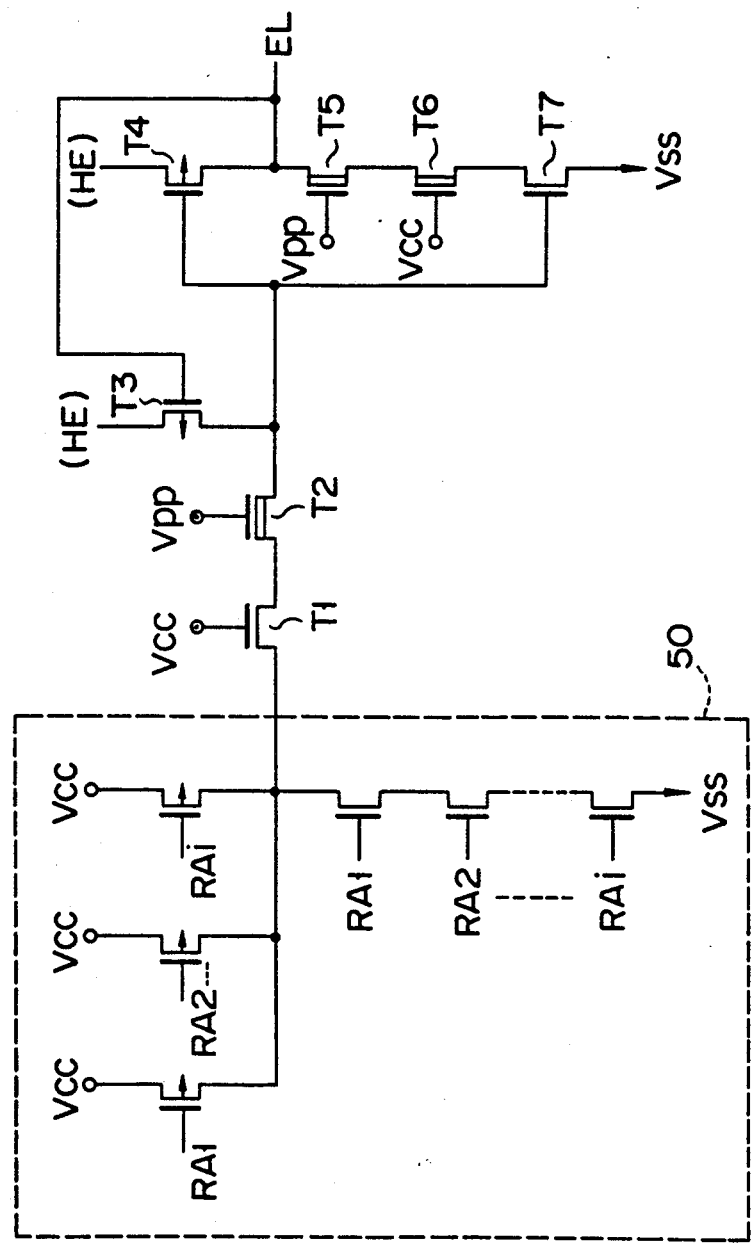
FIG. 8 is a circuit diagram of an erasing gate decoder in FIG. 7.

Each of the erasing gate decoders 43-1 to 43-k can be realized by, e.g., a circuit shown in FIG. 8. Referring to FIG. 8, reference symbol $V_{CC}$ denotes a reference potential, which is normally 5 V; $V_{SS}$, a reference potential, which is normally 0 V; and $V_{PP}$, a high voltage of, e.g., 12.5 V. In addition, reference symbol <HE> denotes an output from the boostup circuit 39 for data erasing. The circuit 39 outputs a boost potential of, e.g., 20 V in the erase mode, and a power source voltage of 5 V in the write mode. The output terminal of a decoder 50 constituted by a NAND gate is connected to transfer gates consisting of transistors $T_1$ and $T_2$. An inverter is connected to the output terminal of the transistor $T_2$. This inverter constitutes a feedback circuit, and its output terminal is connected to an erase line. The transistor $T_1$ is constituted by an enhancement type n-channel. The transistor $T_2$ and transistors $T_5$ and $T_6$ are constituted by depletion type n-channel transistors, and serve as high-voltage reduction transfer gates for reducing a potential difference applied to a gate oxide film when the voltage <He> is set at the boost potential. An output from the circuit shown in FIG. 8 is supplied to the erase line EL (one of the erase lines EL1 to ELk).

Figure 6:
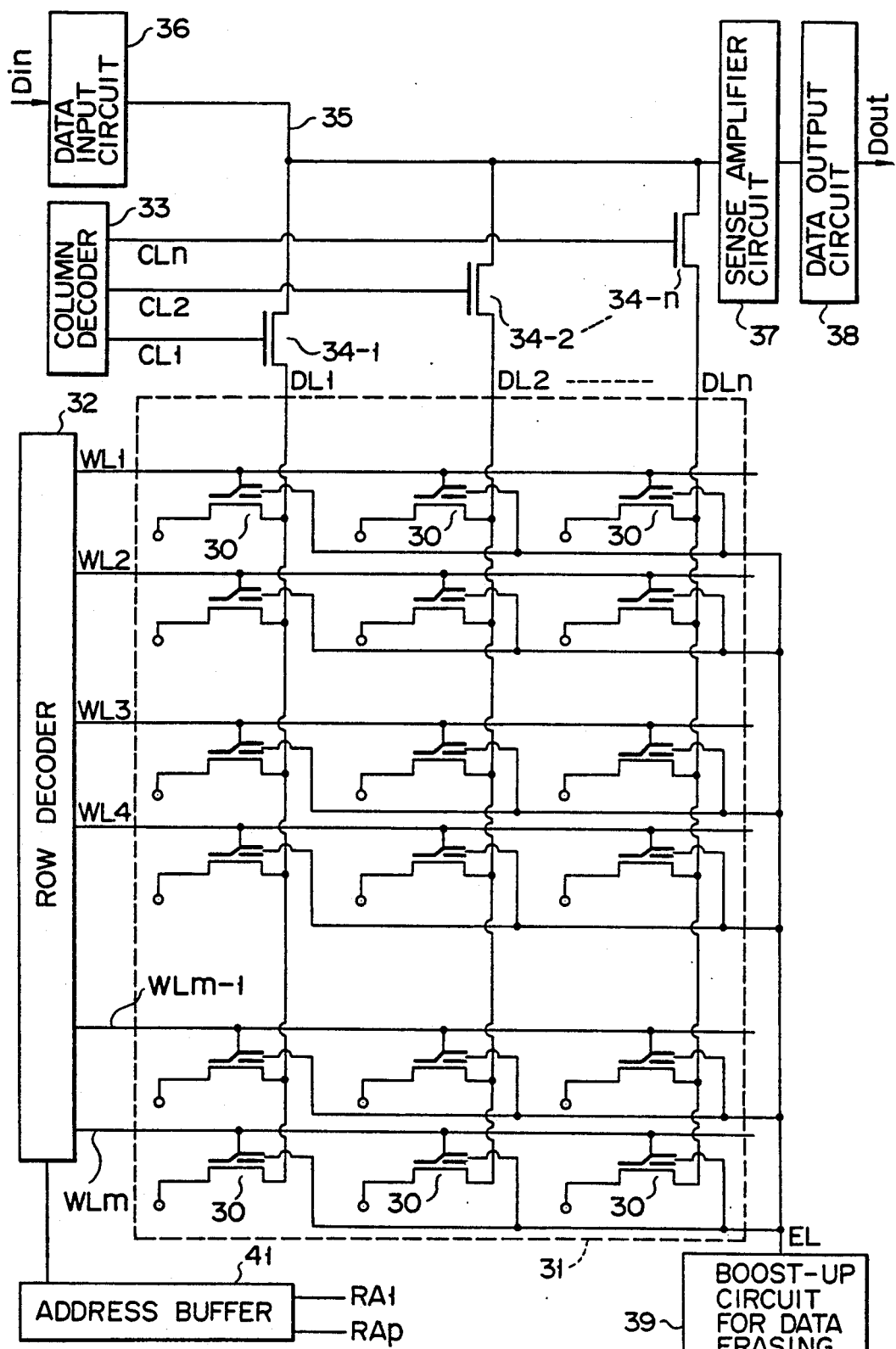
FIG. 6 is a circuit diagram showing an arrangement of a conventional semiconductor memory.

A stress time in a weak erase state, which is described with reference to FIG. 5, in this embodiment will be considered. In the circuit shown in FIG. 7, a given erase gate is set at 5 V in the data write mode during an interval in which data is written in a memory cell in a corresponding one of the block memory cell arrays 42-1 to 42-k, i.e., an interval corresponding to n×l (the number of column lines × the number of row lines in one block) bits. In this case, if a write time per bit is set to be t, a time in which an erroneous stress acts on a word line different from the word line of a selected cell corresponds to $\{(l-1)\times n\}\times t$. In relation to the value m in the conventional circuit shown in FIG. 6, m=l×k (k is the number of blocks) is established, and the ratio of the stress time of the circuit of this embodiment to that of the conventional circuit is about 1/k.

In this embodiment, a 1-bit read/write EEPROM is exemplified. However, the present invention may be applied to an EEPROM for reading/writing a plurality of bits in parallel, which is obtained by arranging a plurality of memory cell arrays 31, bus lines 35, data input circuits 36, sense amplifier circuits 37, and data output circuits 38 in parallel (e.g., 8-bit or 16-bit arrangement). In this case, a 1 M-bit (128 K words×8 bits) memory similar to the one obtained by the conventional techniques will be considered. If the number of memory cells in one block memory cell array is 1 K byte, n (the number of data lines)=128, l (the number of word lines)=8, and k (the number of blocks) =128. A time in which an erroneous stress acts on a word line which is different from the word line of a selected cell is given as:

$$1 \text{ ms} \times (8-1) \times 128 = 896 \text{ ms} \approx 0.9$$

When this stress time is compared with that of the conventional memory, since $0.9/131 \approx 1/145$, it is apparent that the stress time can be greatly shortened, and reliability against erroneous erasure can be improved.

FIG. 9 shows another embodiment of the present invention. A write operation in this embodiment is performed in the same manner as in the embodiment shown in FIG. 7. This embodiment has a characteristic feature in an address buffer 47 for data erasing. In the erase mode, one of erasing gate decoders 46-1 to 46-k is selectively operated by an output from the address buffer 47 to which erase addresses $EA_1$ to $EA_i$ are supplied. In addition, the erasing gate decoders 46-1 to 46-n incorporate boostup circuits. A boosted potential is output from the selectively operated decoder as a gate potential $V_{EG}$ to either of erase lines $EL_1$ to $EL_k$, and data of all the memory cells in the selected block cell array are erased. The data of the memory cells of the non-selected block cell arrays are not erased. In addition, all the erasing gate decoders can be collectively selected. In this case, the data of all the memory cells of the memory cell array 31 are collectively erased. Furthermore, by utilizing a function of the semiconductor memory shown in FIG. 9 mentioned above, all the memory cell of the memory cells of the memory cell array 31 can be collectively tested when a stress test is performed in which a predetermined potential is applied to the erasing gates of the memory cells. Therefore, the test time is decreased. Each erasing gate decoder in this embodiment can be realized by, e.g., a circuit shown in FIG. 10. Referring to FIG. 10, reference symbol $\phi V_{PP}$ denotes a signal (output from a charge pump circuit) oscillating at a predetermined period between 0 V to $V_{PP}$ in the erase mode. During an erase operation, in an erasing gate decoder selected by selection signals $EA_1$ to $EA_i$, a high potential $V_{PP}$ is boosted by a boostup circuit constituted by transistors $T_{10}$, $T_{11}$, and $T_{12}$ and a capacitor $C_1$, and the boosted potential is output as an erasing gate potential to the erase line (one of the erase lines EL1 to ELk).

As described above, according to this embodiment, only a block which is designated by erase addresses $EA_1$ to $EA_i$ can be erased, and hence the boostup circuit can be reduced in size.

Note that the erase addresses $EA_1$ to $EA_i$ are arbitrary values, and block selecting addresses $RA_1$ to $RA_i$ may be used for them. In addition, the erasing gate decoder shown in FIG. 8 may be used in place of the erasing gate decoder of the semiconductor memory shown in FIG. 9. In this case, erase address signals are input to the circuit in the same manner as in FIG. 10, and the boostup circuit 39 for data erasing in the semiconductor memory shown in FIG. 7 may be arranged therein. It is apparent that the circuit shown in FIG. 10 may be used in place of the erasing gate decoder of the semiconductor memory shown in FIG. 7.

FIG. 11 is a circuit diagram showing an erasing gate decoder having an arrangement which is different from the erasing gate decoder of the semiconductor memory of the present invention shown in FIG. 9. Referring to FIG. 11, reference symbol Eosc denotes a signal oscillating at a predetermined period between a reference voltage of 0 V and a reference voltage $V_{CC}$ in the data erase mode. During a data erase operation, in an erasing gate decoder selected by erase addresses $EA_1$ to $EA_i$, the gate potential of a transistor $T_{17}$ is set at the reference voltage $V_{CC}$, and a circuit constituted by transistors $T_{15}$ to $T_{17}$ is started to amplify the signal Eosc to a value between a reference voltage of 0 V and a high voltage $V_{PP}$. The amplified signal is then supplied to a boostup circuit constituted by a capacitor $C_1$ and transistors $T_{11}$ to $T_{13}$, thus starting a boost operation.

The transistor $T_{13}$ in the circuit shown in FIG. 11 serves to quickly turn on the transistor $T_{10}$ by increasing the gate potential of the transistor $T_{10}$ to which the high voltage $V_{PP}$ is applied.

With regard to the erasing gate decoder shown in FIG. 10, identical erasing gate decoders connected to all the block memory arrays perform a boost operation in the data erase mode regardless of selected or non-selected blocks. However, the transistor $T_8$ of a selected block is set in an OFF state, whereas the transistor $T_8$ of each non-selected block is set in an ON state due to the characteristics of the transistor $T_8$. As a result, the boosted potential is output as an erasing gate potential to the erase line EL of the erasing gate decoder of only the selected block. In the circuit shown in FIG. 11, however, since the gate of the transistor $T_{17}$ of each non-selected block is set at "0" level, neither amplification of a signal nor a boost operation are performed. Therefore, the boostup circuit of only a selected block can be operated.

FIG. 12 is a circuit diagram showing an erasing gate decoder having an arrangement which is different from that of the erasing gate decoder (shown in FIG. 10) of the semiconductor memory of the present invention shown in FIG. 9. The circuit in FIG. 12 is different from the one in FIG. 11 in that a transistor $T_{14}$ is added. The boost potential of the boostup circuit is lowered by the threshold value of the transistor $T_{14}$.

The circuit shown in FIG. 12 is used in order to decrease the boost potential if the boost potential is too high.

FIG. 13 is a circuit diagram showing an erasing gate decoder having an arrangement which is different from that of the erasing gate decoder (FIG. 10) of the semiconductor memory of the present invention shown in FIG. 9. The circuit in FIG. 13 is different from the one in FIG. 11 in that the transistor $T_{13}$ is omitted, and a transistor $T_{18}$ is added.

Each of the transistors $T_{13}$ and $T_{18}$ respectively shown in FIGS. 11 and 13 serves as a transistor for supplying a gate potential to the transistor $T_{10}$ to which the high voltage $V_{PP}$ is applied. In the circuit shown in FIG. 11, since a gate potential is applied to the transistor $T_{10}$ through the transistors $T_{11}$ and $T_{12}$ which have threshold values close to 0 V, the gate potential is lowered because of their threshold values. In the circuit shown in FIG. 13, however, since a gate potential is applied to a transistor $T_{10}$ through only a depletion type transistor $T_9$, no decrease in potential due to a threshold value occurs. As a result, the transistor $T_{10}$ can be quickly turned on.

FIG. 14 is a plan view showing a pattern of the semiconductor memories shown in FIGS. 7 and 9. More particularly, FIG. 14 shows an arrangement of the erase lines and a separation system of each block. Referring to FIG. 14, reference symbol WL denotes a word line; SL, a source line; and EL, an erase line.

Figure 15:
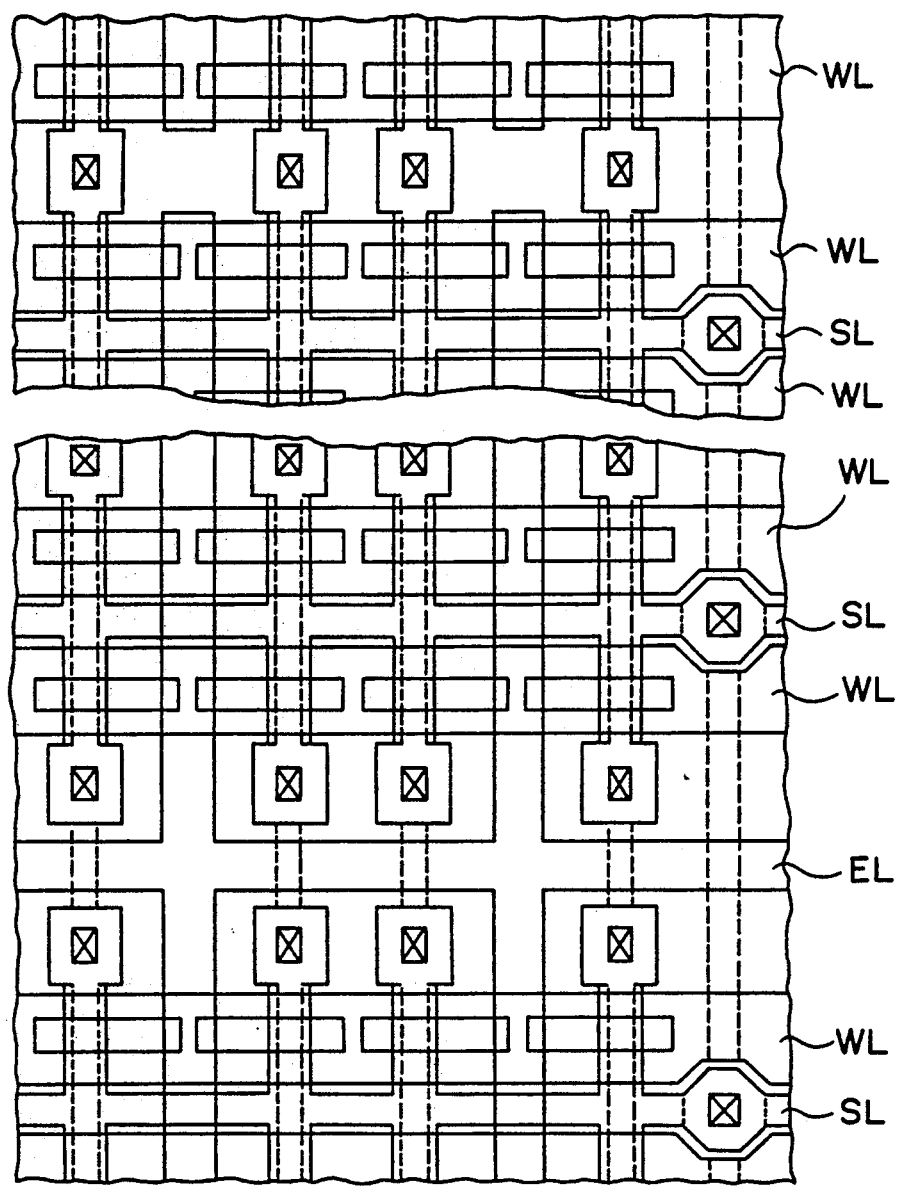

FIG. 15 is a plan view showing a pattern of the semiconductor memories of the present invention shown in FIGS. 7 and 9, which is different from the one shown in FIG. 14. The same reference symbols in FIG. 15 denote the same parts as in FIG. 14.

FIGS. 16A is a circuit diagram showing another detailed arrangement of an input section of the semiconductor memories of the present invention in FIGS. 7 and 9. FIG. 16B is a circuit diagram showing a detailed arrangement of an erase predecoder in FIG. 16A.

In FIG. 16B, reference symbol ALL means a signal for collectively erasing, all the erase decoders can be erased by inputting this signal.

What is claimed is:

1. A non-volatile semiconductor memory comprising:
    a plurality of block memory cell arrays formed by dividing a memory cell array into a plurality of blocks, said memory cell array being formed by arranging a plurality of memory cells in the form of a matrix of word lines and column lines;
    a plurality of source regions, one included in each of said memory cells;
    a plurality of drain regions, one included in each of said memory cells;
    a plurality of floating gates, one included in each of said memory cells;
    a plurality of control gates, one included in each of said memory cells and each capacitively coupled to a respective one of said floating gates;
    a plurality of erasing gates, one included in each of said memory cells and each capacitively coupled to a respective one of said floating gates;
    a plurality of source lines each connected to a respective one of said plurality of source regions of said memory cells; and
    a plurality of erase lines each respectively connected to said erasing gates of one of said plurality of block memory cell arrays independently of each other, said erasing lines being formed independently of said source lines, wherein
    a voltage of a predetermined value is applied to at least one of said erase lines of a selected block memory cell array of said plurality of block memory cell arrays, in a data write mode.

2. The memory according to claim 1, wherein said plurality of block memory cell arrays are formed by dividing said plurality of memory cells into blocks of units each including at least one row line.

3. The memory according to claim 1, wherein in a data write mode, a voltage which is lower than the voltage of the predetermined value to be applied to said erase line connected to said erasing gate of said memory cell of said selected block memory cell array is applied to said erase lines of said erasing gates of said memory cells of said non-selected block memory cell arrays of said plurality of block memory cell arrays.

4. The memory according to claim 1, wherein in a data write mode, no voltage is applied to said erase lines connected to said erasing gates of said non-selected block memory cell arrays of said plurality of block memory cell arrays.

5. A non-volatile semiconductor memory device including a plurality of memory cells forming a memory cell array, each memory cell including a control gate and a drain, comprising:
- a plurality of block memory cell arrays formed by dividing a memory cell array into a plurality of blocks, said memory cell array being formed by arranging said plurality of memory cells as a matrix of rows and columns;
- a plurality of row decoders each connected to one of said plurality of block memory cell arrays, for selecting at least one of said plurality of block memory cell arrays in a data write mode;
- address buffer means, connected to said plurality of row decoders, for supplying an address signal to said plurality of row decoders;
- a column decoder, connected to said drains of said plurality of memory cells, for selecting at least one of said columns of said matrix;
- a plurality of erase gate decoders, each connected to one of said plurality of block memory cell arrays, for receiving said address signal in said data write mode; and
- a plurality of erase lines, each connecting one of said erase gate decoders and one of said plurality of block memory cell arrays, wherein at least one of said erase lines, connected to corresponding erase gate decoders of said at least one selected block memory cell array, has a first voltage while the remaining erase lines have a second voltage, lower than said first voltage, in said data write mode.

6. The semiconductor memory device according to claim 5, wherein each of said plurality of erase gate decoders includes a boost-up circuit for data erasing.

7. The semiconductor memory device according to claim 5, wherein said first voltage is a power source voltage and said second voltage is a reference voltage.

8. The semiconductor memory device according to claim 6, wherein said boost-up circuit comprises:
- an oscillating amplifier, having an output terminal, for increasing the voltage of said boost-up circuit from a first oscillating voltage having a first amplitude to a second oscillating voltage having a second amplitude, larger than said first amplitude;
- a transfer circuit, connected to said oscillating amplifier, for receiving a third voltage and for transferring said third voltage to said output terminal; and
- an adder, connected to said transfer circuit for adding said second oscillating voltage and said third voltage and for supplying the added voltage to said plurality of erase lines.

9. The semiconductor memory device according to claim 8, wherein said boost-up circuit comprises means for decreasing said added voltage from said adder when it is greater than a predetermined value.

10. The semiconductor memory device according to claim 5, wherein said plurality of erase lines are arranged in parallel.

11. A non-volatile semiconductor memory device including a plurality of memory cells forming a memory cell array, each of said memory cells including a control gate and a drain, comprising:
- a plurality of block memory cell arrays formed by dividing a memory cell array into a plurality of blocks, said memory cell array being formed by arranging said plurality of memory cells as a matrix of rows and columns;
- a plurality of row decoders each connected to one of said plurality of block memory cell arrays, for selecting at least one of said plurality of block memory cell arrays in a data write mode;
- address buffer means, connected to said plurality of row decoders, for supplying an address signal to said plurality of row decoders;
- a column decoder, connected to said drains of said plurality of memory cells, for selecting at least one of said columns of said matrix;
- a plurality of erase gate decoders, each connected to one of said plurality of block memory cell arrays, for receiving said address signal in said data write mode;
- a data-erasing boost-up circuit, connected to said plurality of erase gate decoders, for supplying a boosted voltage to said plurality of erase gate decoders in an erase mode; and
- a plurality of erase lines, each connecting one of said erase gate decoders and one of said plurality of block memory cell arrays, wherein at least one of said erase lines, connected to corresponding erase gate decoders of said at least one selected block memory cell array, has a first voltage while the remaining erase lines have a second voltage, lower than said first voltage, in said data write mode.

12. The semiconductor memory device according to claim 11, wherein said each of said plurality of erase gate decoders includes a boost-up circuit for data erasing.

13. The semiconductor memory device according to claim 11, wherein said first voltage is a power source voltage and said second voltage is a reference voltage.

14. The semiconductor memory device according to claim 12, wherein said boost-up circuit comprises:
- an oscillating amplifier, having an output terminal, for increasing the voltage of said boost-up circuit from a first oscillating voltage having a first amplitude to a second oscillating voltage having a second amplitude, larger than said first amplitude;
- a transfer circuit, connected to said oscillating amplifier, for receiving a third voltage and for transferring said third voltage to said output terminal; and
- an adder, connected to said transfer circuit, for adding said second oscillating voltage and said third voltage and for supplying the added voltage to said plurality of erase lines.

15. The semiconductor memory device according to claim 14, wherein said boost-up circuit comprises means for decreasing the added voltage from said adder when it is greater than a predetermined value.

16. The semiconductor memory device according to claim 11, wherein said plurality of erase lines are arranged in parallel.

* * * * *